US009337317B2

(12) United States Patent
Basker et al.

(10) Patent No.: US 9,337,317 B2
(45) Date of Patent: May 10, 2016

(54) SEMICONDUCTOR DEVICE INCLUDING FINFET AND DIODE HAVING REDUCED DEFECTS IN DEPLETION REGION

(71) Applicant: GLOBALFOUNDRIES INC., Grand Cayman (KY)

(72) Inventors: Veeraraghavan S. Basker, Schenectady, NY (US); Tenko Yamashita, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/697,670

(22) Filed: Apr. 28, 2015

(65) Prior Publication Data
US 2015/0243767 A1    Aug. 27, 2015

Related U.S. Application Data

(63) Continuation of application No. 13/909,673, filed on Jun. 4, 2013, now Pat. No. 9,059,287, which is a continuation of application No. 13/888,680, filed on May 7, 2013, now Pat. No. 8,941,161.

(51) Int. Cl.
H01L 29/66       (2006.01)
H01L 21/265      (2006.01)
H01L 21/311      (2006.01)
H01L 21/28       (2006.01)
H01L 21/266      (2006.01)
H01L 29/78       (2006.01)
H01L 27/06       (2006.01)
H01L 29/861      (2006.01)
H01L 21/8234     (2006.01)

(52) U.S. Cl.
CPC ........ *H01L 29/66795* (2013.01); *H01L 21/266* (2013.01); *H01L 21/26513* (2013.01); *H01L 21/28035* (2013.01); *H01L 21/31111* (2013.01); *H01L 21/823431* (2013.01); *H01L 27/0629* (2013.01); *H01L 29/6609* (2013.01); *H01L 29/66128* (2013.01); *H01L 29/785* (2013.01); *H01L 29/8611* (2013.01)

(58) Field of Classification Search
CPC .................. H01L 21/26513; H01L 21/31111; H01L 21/28035; H01L 21/266
See application file for complete search history.

(56) References Cited

U.S. PATENT DOCUMENTS

| 6,765,303 | B1 | 7/2004 | Krivokapic et al. |
| 6,835,967 | B2 | 12/2004 | Yeo et al. |
| 6,885,055 | B2 | 4/2005 | Lee |
| 7,323,373 | B2 | 1/2008 | Mathew et al. |
| 7,560,784 | B2 | 7/2009 | Cheng et al. |

(Continued)

*Primary Examiner* — Kevin Parendo
(74) *Attorney, Agent, or Firm* — David Cain; Andrew M. Calderon; Roberts Mlotkowski Safran & Cole, P.C.

(57) ABSTRACT

A semiconductor device comprises a first substrate portion and a second substrate portion disposed a distance away from the first substrate portion. The first substrate portion includes a first active semiconductor layer defining at least one semiconductor fin and a first polycrystalline layer formed directly on the fin. The first polycrystalline layer is patterned to define at least one semiconductor gate. The second substrate portion includes a doped region interposed between a second active semiconductor region and an oxide layer. The oxide layer protects the second active semiconductor region and the doped region. The doped region includes a first doped area and a second doped area separated by the first doped region to define a depletion region.

8 Claims, 16 Drawing Sheets

(56) References Cited

U.S. PATENT DOCUMENTS

| | | |
|---|---|---|
| 2003/0013254 A1 | 1/2003 | Tsuji |
| 2006/0063334 A1 | 3/2006 | Donze et al. |
| 2007/0000427 A1 | 1/2007 | Umeno et al. |
| 2008/0149984 A1* | 6/2008 | Chang .................. H01L 27/108 257/314 |
| 2008/0186771 A1 | 8/2008 | Katsumata et al. |
| 2010/0090302 A1* | 4/2010 | Nguyen Hoang .... H03H 3/0072 257/428 |
| 2011/0095347 A1 | 4/2011 | Russ et al. |
| 2011/0169101 A1 | 7/2011 | Doornbos et al. |
| 2013/0175578 A1 | 7/2013 | Lee et al. |
| 2013/0285208 A1* | 10/2013 | Standaert et al. ............. 257/546 |
| 2014/0191319 A1 | 7/2014 | Cheng et al. |

* cited by examiner

SEMICONDUCTOR DEVICE INCLUDING FINFET AND DIODE HAVING REDUCED DEFECTS IN DEPLETION REGION

DOMESTIC PRIORITY

This application is a continuation of U.S. patent application Ser. No. 13/909,673, filed Jun. 4, 2013, which is a continuation of U.S. patent application Ser. No. 13/888,680, filed May 7, 2013, now U.S. Pat. No. 8,941,161, the disclosures of which are incorporated by reference herein in their entireties.

BACKGROUND

The present invention relates generally to semiconductor devices, and more particularly, to a semiconductor device including a finFET and a diode having reduced defects in the depletion area.

Conventional finFET semiconductors devices may include one or more diodes to perform various functions including voltage rectification, circuit protection, voltage biasing and thermal sensing. For example, when using an external thermal diode to measure temperature, the accuracy of the temperature measurement may be affected by the ideality factor which contributes to the sensitivity of the diode.

Referring to FIG. 1A, a cross-sectional view illustrating a conventional semiconductor device 10 in a first orientation is illustrated. The conventional semiconductor device 10 includes a first portion 12 having a fin area 14 and a second portion 16 having a planar area 18. FIG. 1B is a cross-sectional view in a second orientation of the conventional semiconductor device 10 illustrated in FIG. 1A. In this second orientation, a PC gate area 20 is illustrated being formed in the first portion 12 and the planar area 18 is formed on the second portion 16. During fabrication of the conventional semiconductor device 10, the PC gate area 20 may be etched to form a gate 19 that extends across one or more fins 21. However, over-etching can occur, which erodes the planar area 18 (i.e., forms eroded areas 22) as illustrated in FIGS. 2A-2B. If the planar area 18 comprises a diode, for example, the silicon area of the diode may be eroded thereby reducing the ideality factor.

SUMMARY

According to one embodiment of the present invention, a semiconductor device comprises a first substrate portion and a second substrate portion disposed a distance away from the first substrate portion. The first substrate portion includes a first active semiconductor layer defining at least one semiconductor fin and a first polycrystalline layer formed directly on the fin. The first polycrystalline layer is patterned to define at least one semiconductor gate. The second substrate portion includes a doped region interposed between a second active semiconductor region and an oxide layer. The oxide layer protects the second active semiconductor region and the doped region. The doped region includes a first doped area and a second doped area separated by the first doped region to define a depletion region.

In another embodiment, a method of fabricating a semiconductor device comprises depositing a masking layer on at least one semiconductor fin formed on a first substrate portion of the semiconductor device. The method further comprises forming a planar substrate on a second substrate portion located a distance away from the first substrate portion. The method further comprises forming an oxide layer on the masking layer and on the planar substrate. The method further comprises forming a resist layer on the oxide layer disposed on the planar substrate. The method further comprises etching the oxide layer disposed on the masking layer such that the first substrate portion excludes the oxide layer and the second substrate portion includes the oxide layer.

Additional features are realized through the techniques of the present invention. Other embodiments of the inventive concept are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features of the invention are apparent from the following detailed description taken in conjunction with the accompanying drawings. FIGS. 1A-11 illustrate a series of operations to fabricate a semiconductor device in which:

FIG. 1A is a cross-sectional view illustrating a conventional semiconductor device in a first orientation including a first portion having a fin area and a second portion having a planar area;

FIG. 3 is a cross-sectional view of a semiconductor device in a first orientation showing a first substrate portion including a fin area having a masking layer deposited on a plurality of fins and showing second substrate portion including a planar substrate having a doped region according to an embodiment;

FIG. 4 illustrates the semiconductor device of FIG. 3 in the first orientation after depositing an oxide layer on an upper surface of the masking layer and an upper surface of the doped region;

FIG. 5 illustrates the semiconductor device of FIG. 4, in the first orientation after depositing a resist layer on an upper surface of the oxide layer located at the second substrate portion;

FIG. 6 illustrates the semiconductor device of FIG. 5 in the first orientation following an etching procedure that removes the oxide layer located at the first substrate portion to expose the masking layer;

FIG. 7 illustrates the semiconductor device of FIG. 6 in the first orientation after removing the resist layer to expose the oxide layer formed at the second substrate portion;

FIG. 8 illustrates the semiconductor device of FIG. 7 in the first orientation following an etching process that removes the masking layer at the first substrate portion to expose the fins;

FIG. 11 illustrates the second substrate portion of FIG. 10B undergoing an ion implantation process that forms respective N-doped regions and P-doped regions of the planar region to form a diode.

DETAILED DESCRIPTION

Figure 1A:
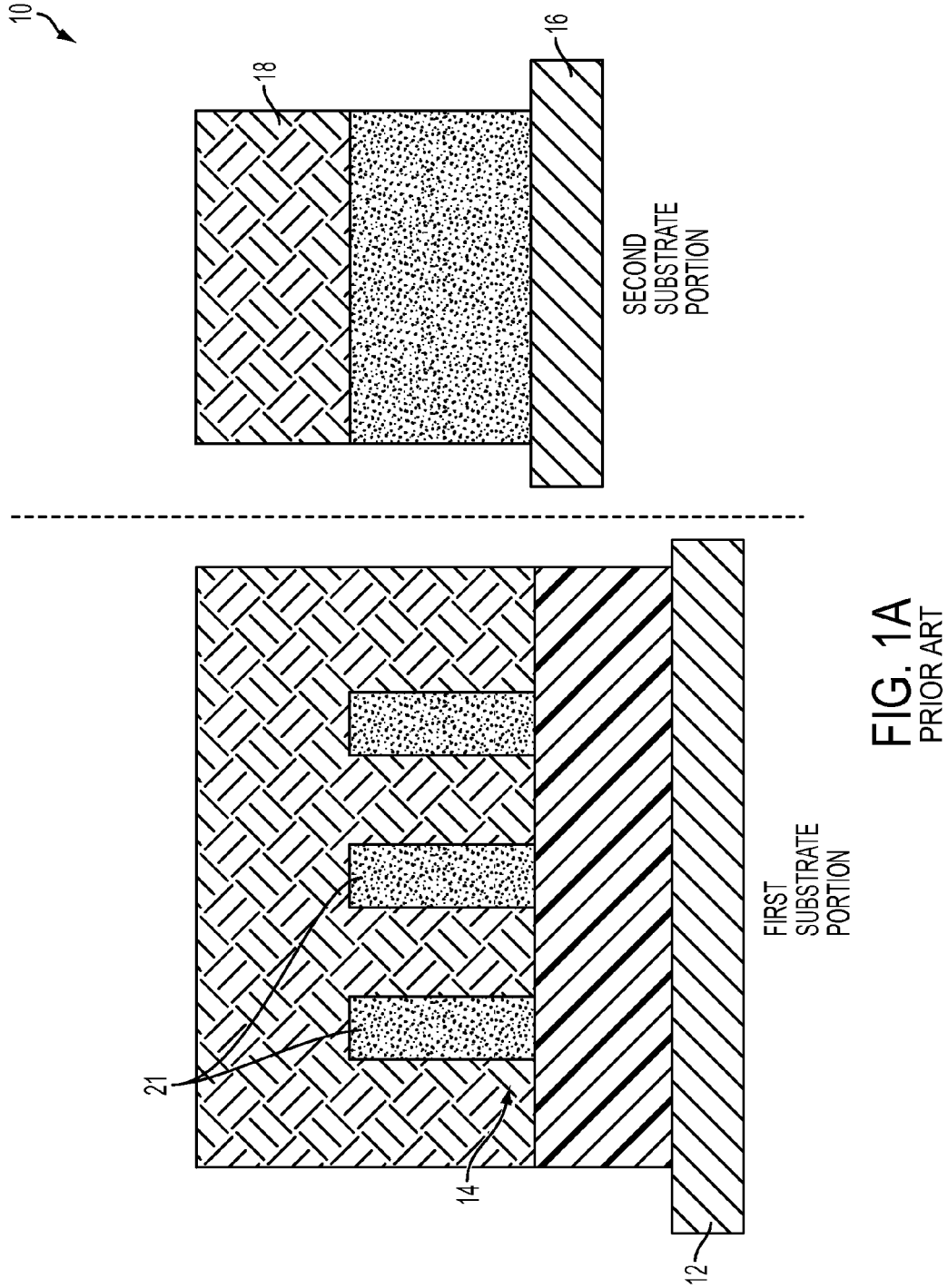
Figure 1B:
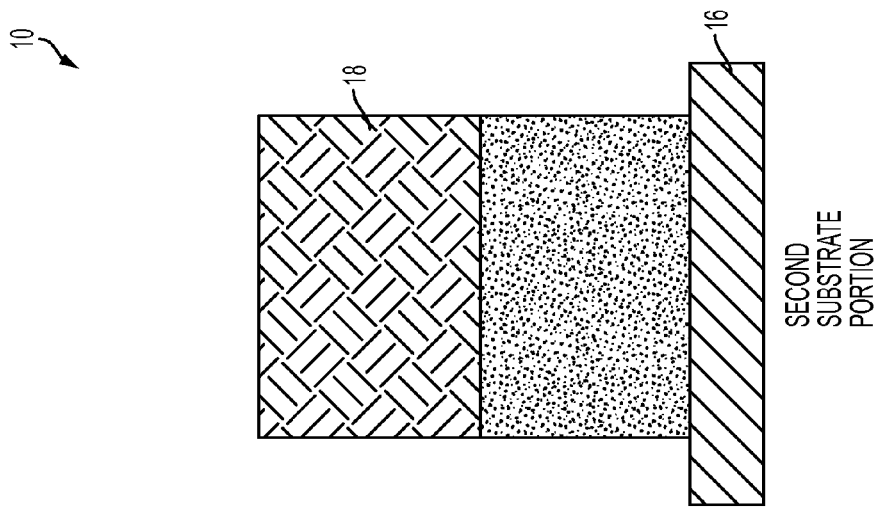
FIG. 1B is a cross-sectional view illustrating the conventional semiconductor device in a second orientation including a gate area formed on the first portion and the planar area formed on the second portion.
Figure 1B:
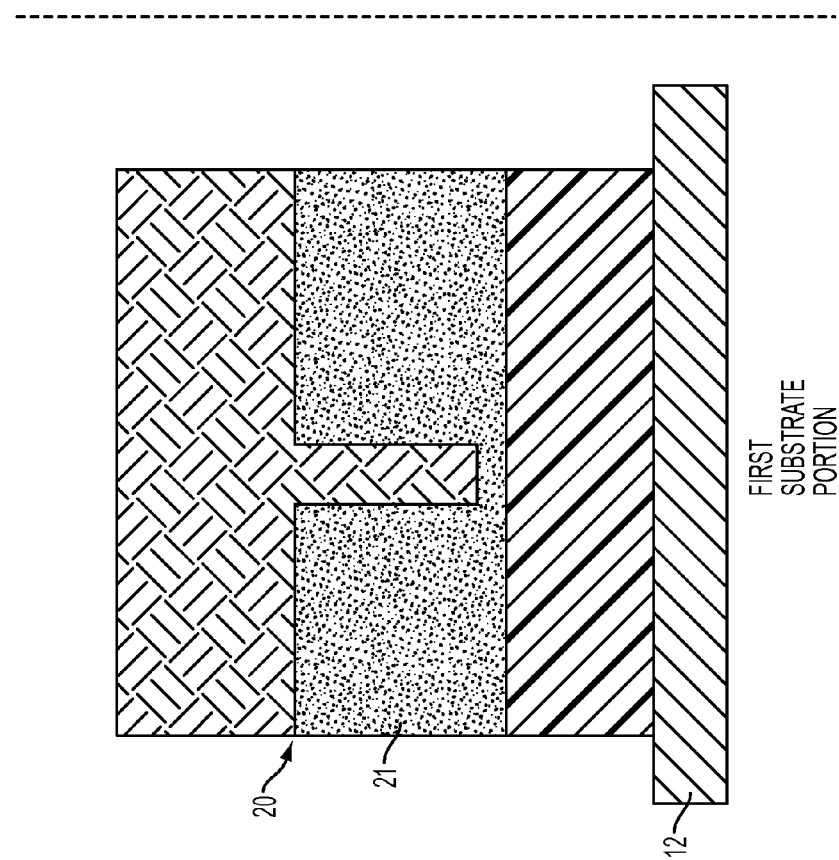
Figure 2A:
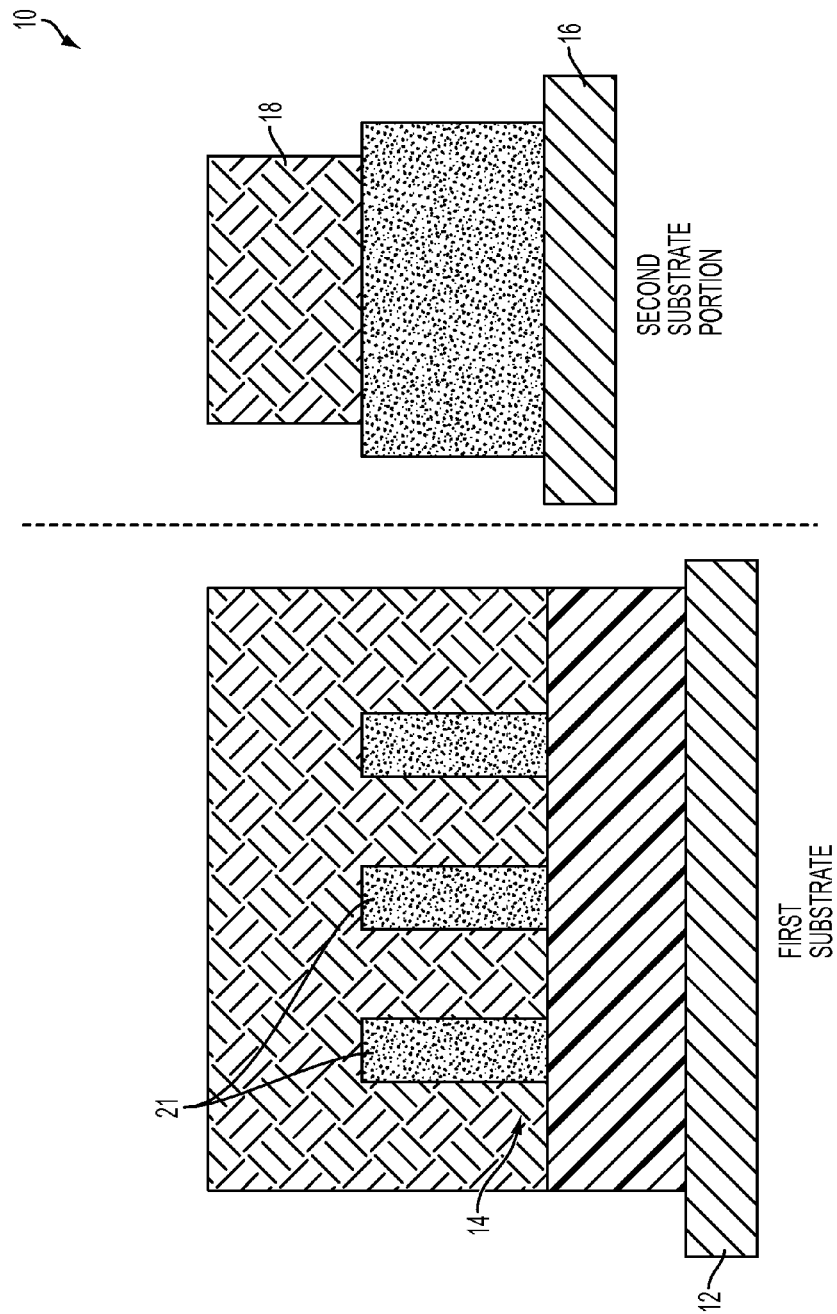
FIG. 2A illustrates the fin area and the planar area of a conventional semiconductor device in the first orientation following an etching process of the gate area.
Figure 2B:
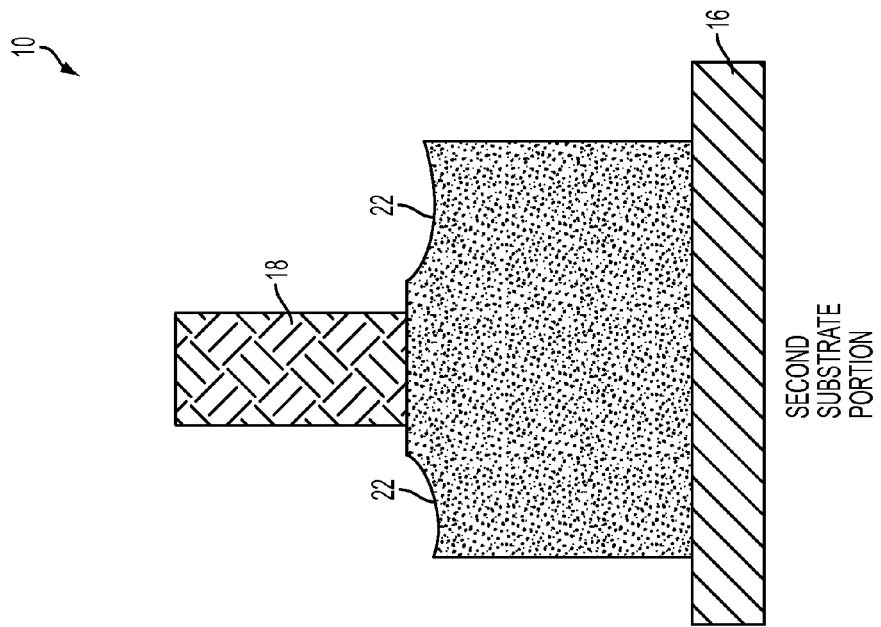
FIG. 2B illustrates the gate area and the planar area following a conventional semiconductor device in the second orientation following the etching process shown in FIG. 2A.
Figure 2B:
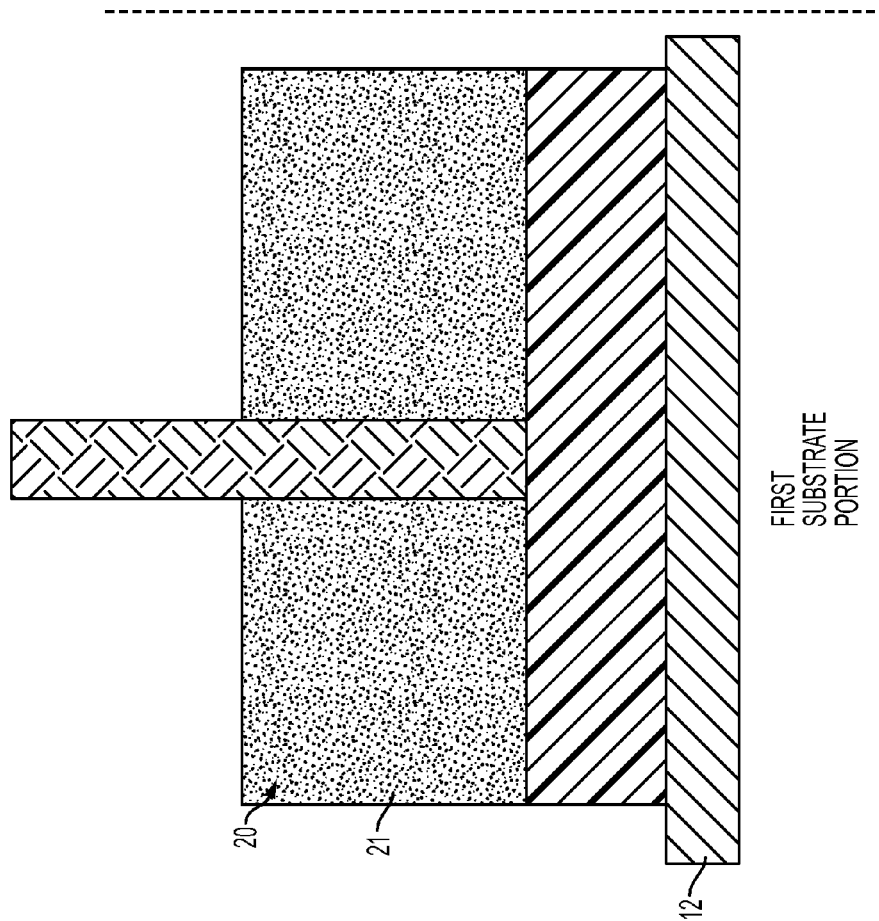
Figure 3:
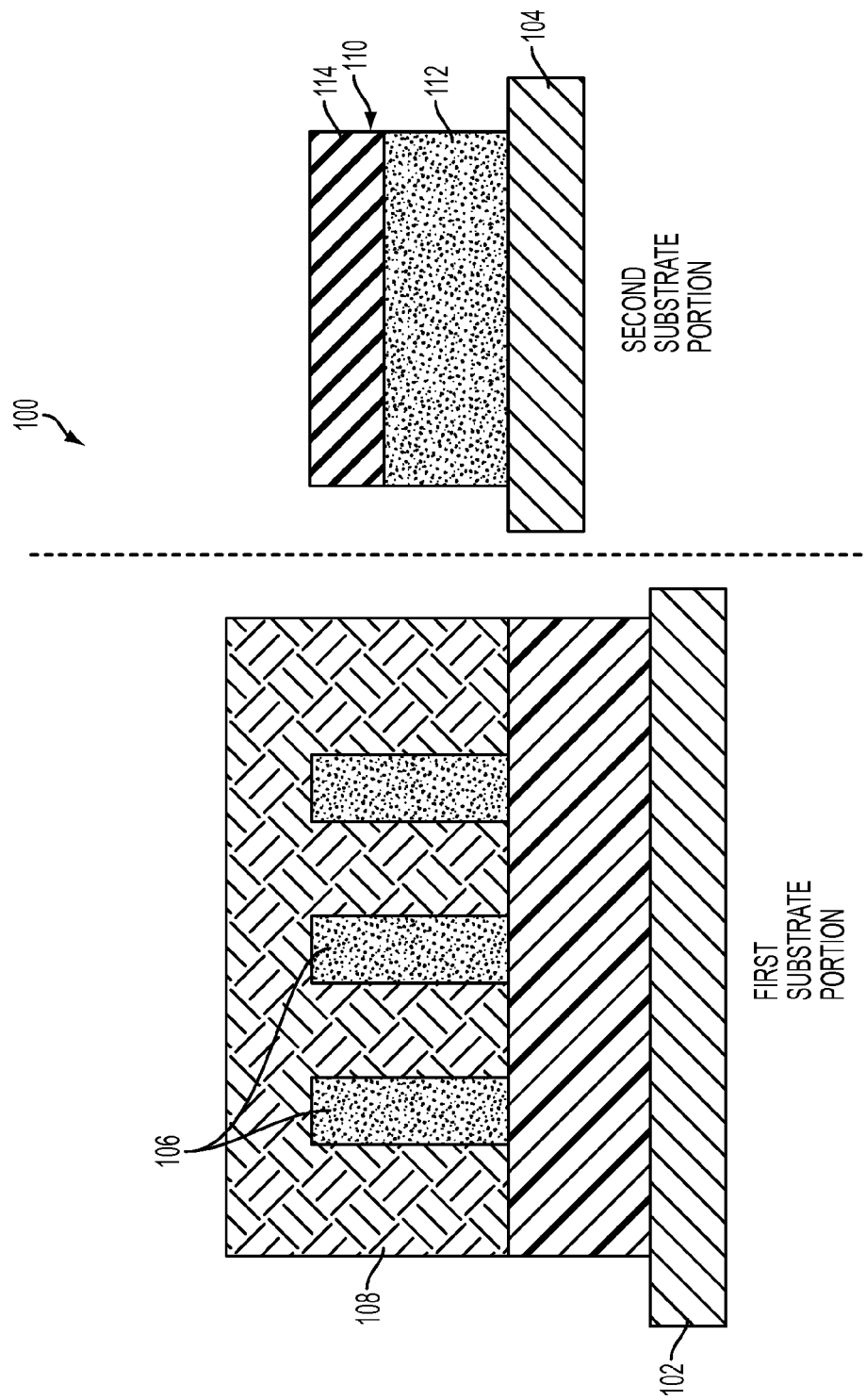

With reference now to FIG. 3, a cross-sectional view of a semiconductor device 100 in a first orientation is illustrated according to an exemplary embodiment of the invention. The semiconductor device 100 includes a first substrate portion 102 and a second substrate portion 104. In the exemplary embodiments described hereinafter, the first and second substrate portions 102, 104 are separated from one another by a predetermined distance. However, each of the first and second substrate portions 102, 104 may at times realize the same fabrication processes. For example, a fabrication process, such as a reactive ion etching (RIE) process, applied to the first substrate portion 102 may also be applied to the second substrate portion 104. One of ordinary skill in the art, however, can appreciate that the fabrication processes described herein are not limited thereto, and one or more fabrication processes may be focused at either the first substrate portion 102 or the second substrate portion 104.

The first substrate portion 102 includes a fin area having one or more semiconductor fins 106 and a masking layer 108 formed on and between the fins 106. The semiconductor fins 106 may comprise an active semiconductor material including, but not limited to, silicon (Si). The masking layer 108 may be formed from, for example, silicon nitride ($Si_3N_4$).

The second substrate portion 104 includes a planar substrate 110 formed thereon. The planar substrate 110 may comprise an active semiconductor material including, but not limited to, Si. In at least one embodiment, the planar substrate 110 includes an active semiconductor region 112 and a doped region 114. The doped region 114 may be formed by implanting doped ions at the active semiconductor region 112. The doped ions may include, for example, boron ions. The doped region 114 may occupy a volume of the active semiconductor region 112 of approximately $1e^{18}$ per cubic centimeters ($cm^3$).

Figure 4:
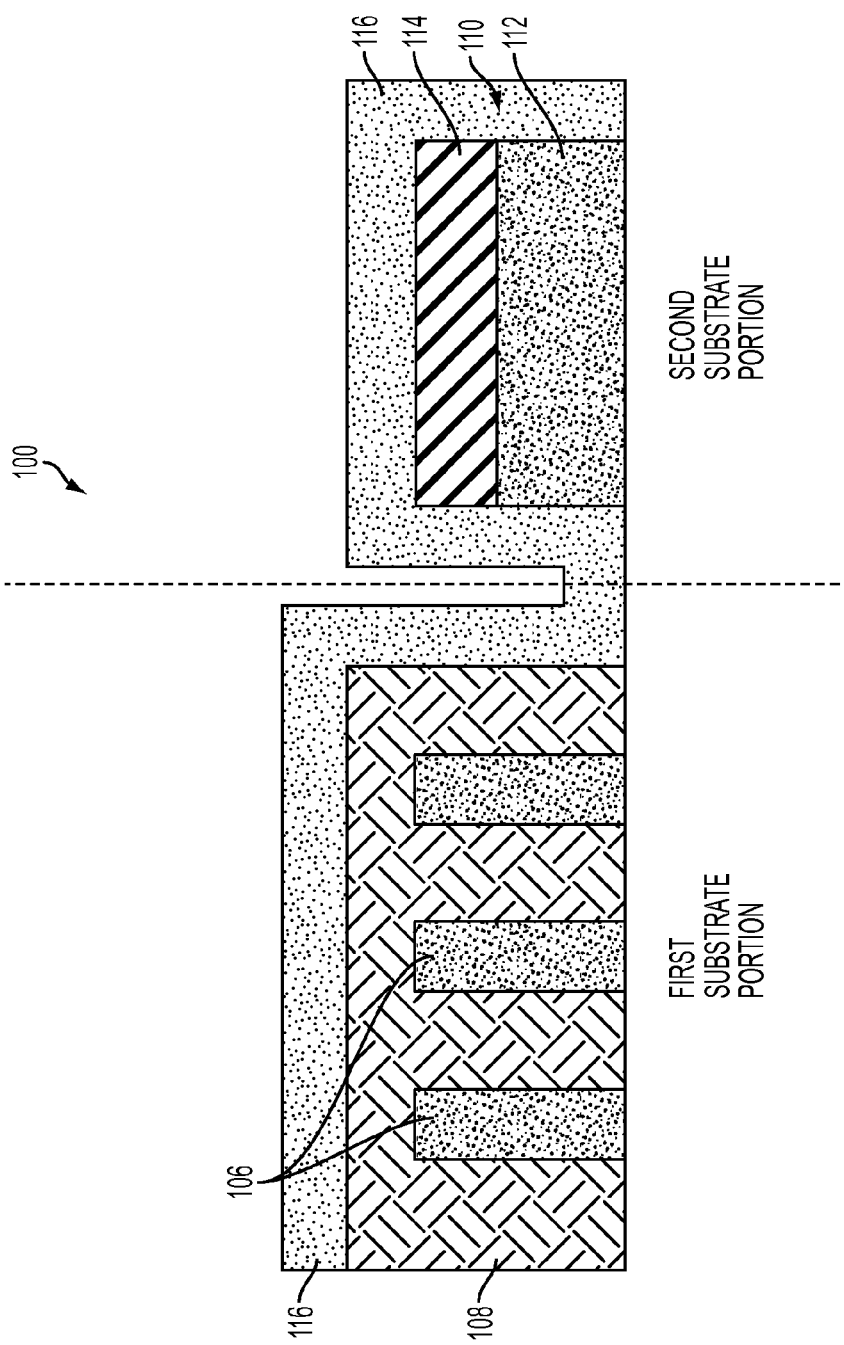

Turning now to FIG. 4, the first and second substrate portions 102, 104 are illustrated following an oxide deposition process. More specifically, an oxide layer 116 may be formed on an upper surface of the masking layer 108 located at the first substrate portion 102, and on the doped region 114 located at the second substrate portion 104 to wrap around the planar substrate 110. The oxide layer 116 may have a thickness ranging from approximately 15 nanometer (nm) to approximately 30 nm. Further, the oxide layer 116 may be continuously formed across the first and second substrate portions 102, 104. Accordingly, the oxide layer 116 may be continuous oxide layer 116 extending from the first substrate portion 102 to the second substrate portion 104.

Figure 5:
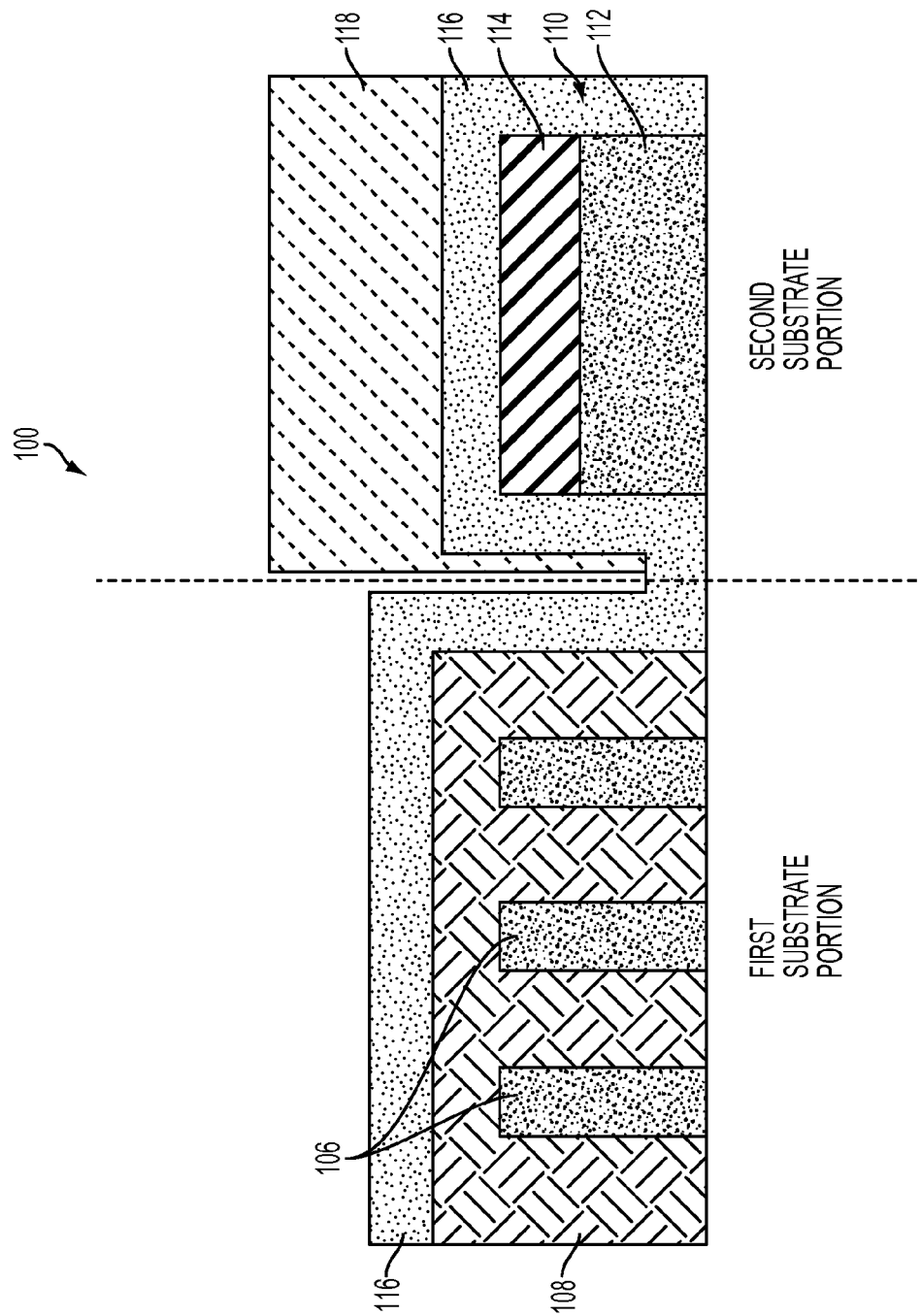
Figure 6:
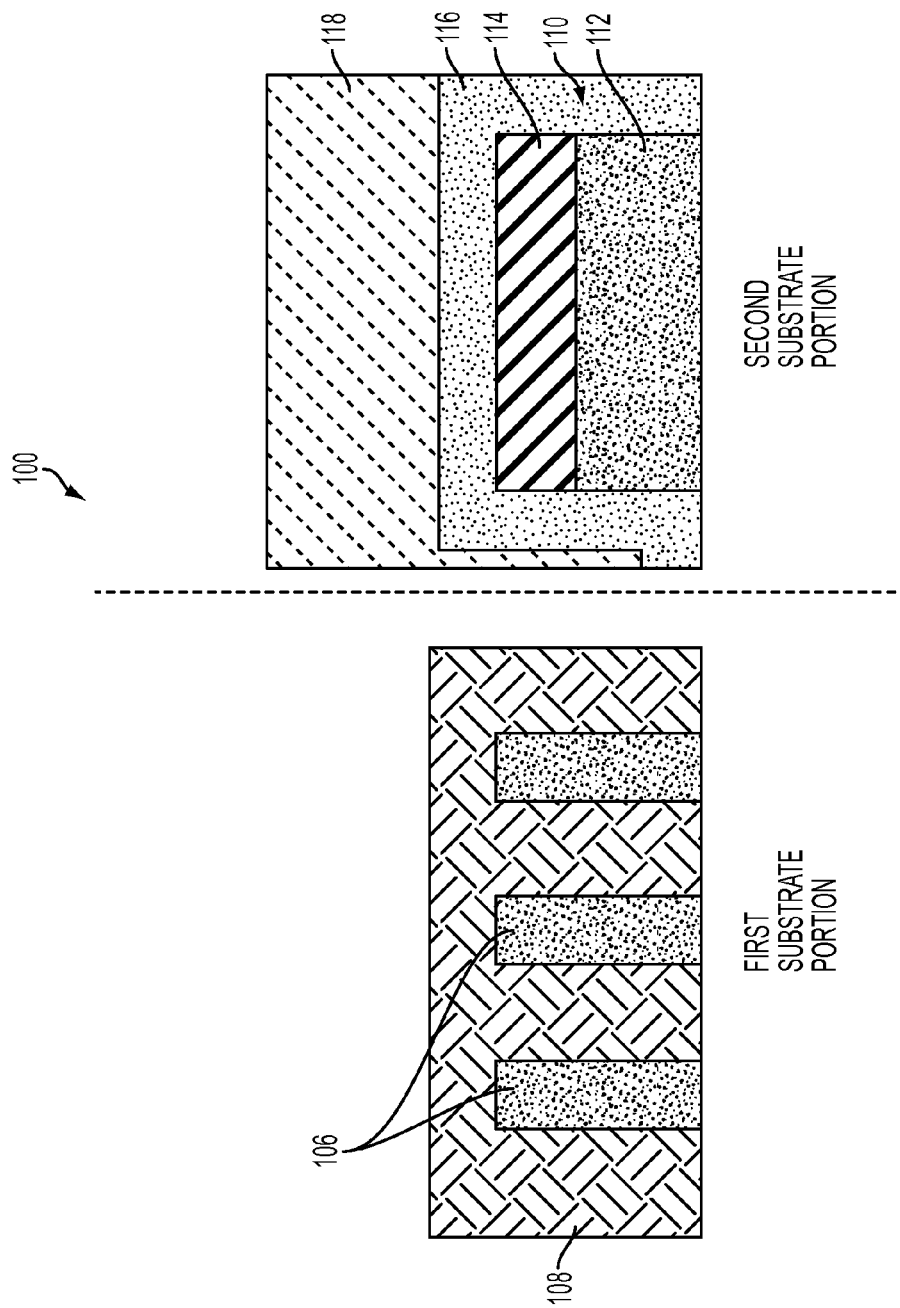

Referring now to FIG. 5, a resist layer 118 is formed on an upper surface of the oxide layer 116 located at the second substrate portion 104. The resist layer 118 may comprise various materials capable of inhibiting degradation of the underlying oxide layer 116. Accordingly, the oxide layer 116 formed at the first substrate portion 102 may be removed without eroding the oxide layer 116 formed at the second substrate portion 104. More specifically, an etching process may be applied to the oxide layer 116 formed on the masking layer 108 located at the second substrate portion 104 to expose the fins 106 as illustrated in FIG. 6. The resist layer 118, however, prevents etching of the oxide layer 116 formed at the second substrate portion 104. Accordingly, the oxide layer 116 is removed from the first substrate portion 102 of the semiconductor device 100 while the oxide layer 116 is maintained at the second substrate portion 104. In other words, the first substrate portion 102 excludes the oxide layer 116, while the oxide layer 116 is maintained at the second substrate portion 104.

Figure 7:
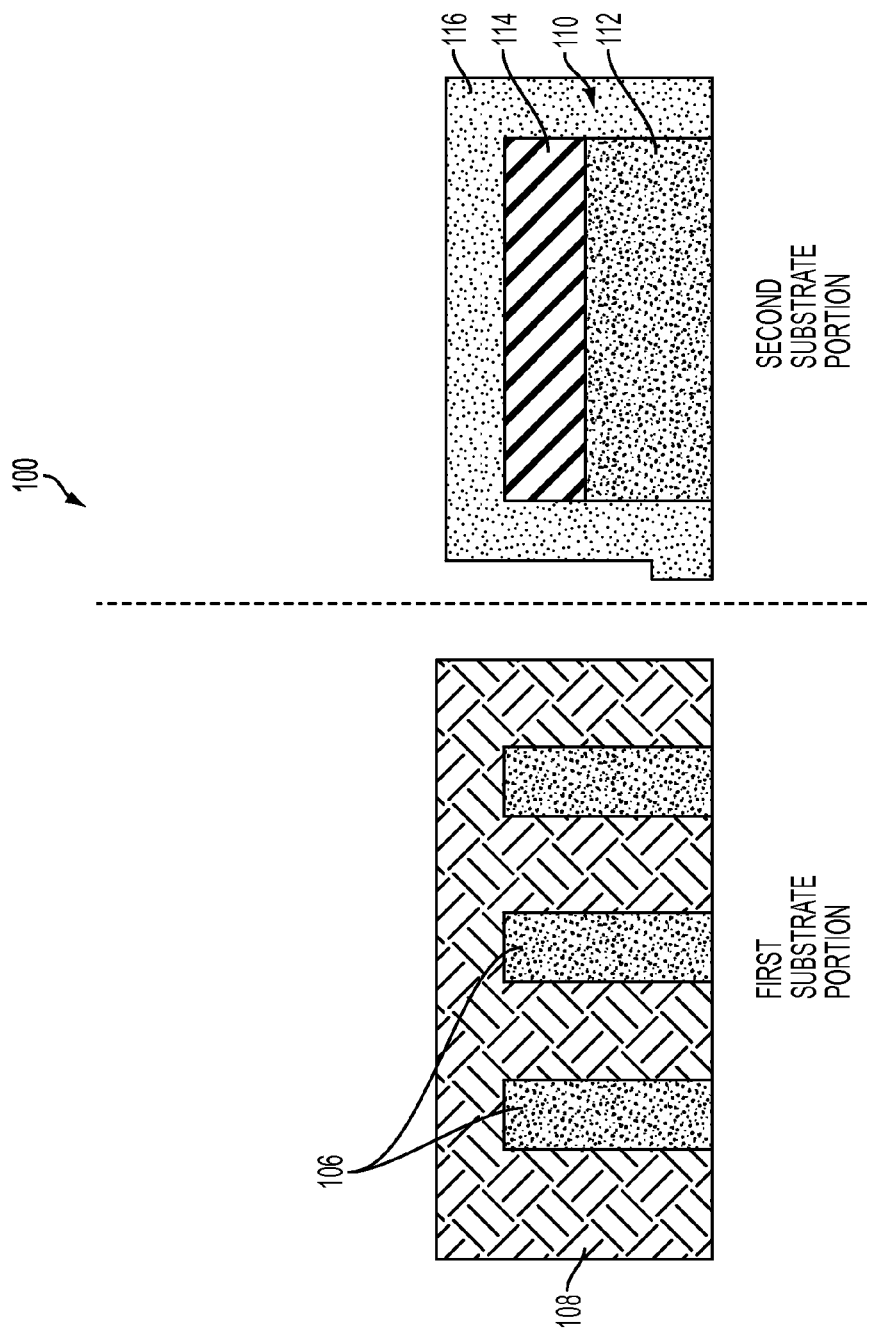
Figure 8:
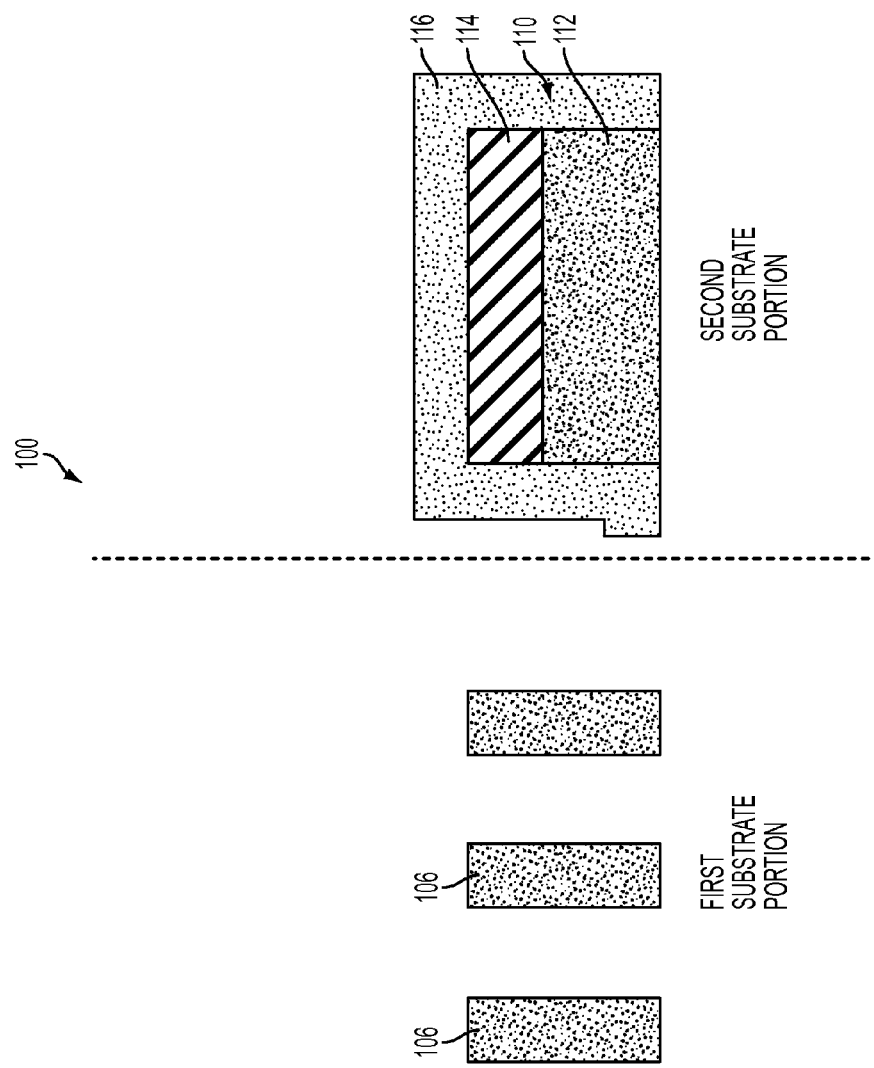

After the oxide layer 116 is removed from the first substrate portion 102, the resist layer 118 may be removed from the oxide layer 116 formed at the second substrate portion 104, as illustrated in FIG. 7. Accordingly, the upper surface of the masking layer 108 formed at the first substrate portion 102 and the upper surface of the oxide layer 116 formed at the second substrate portion 104 are exposed. An etching process may be applied to the first substrate portion 102 to remove the masking layer 108 and expose the fins 106 and areas between and/or adjacent to the fins 106, as illustrated in FIG. 8.

Figure 9A:
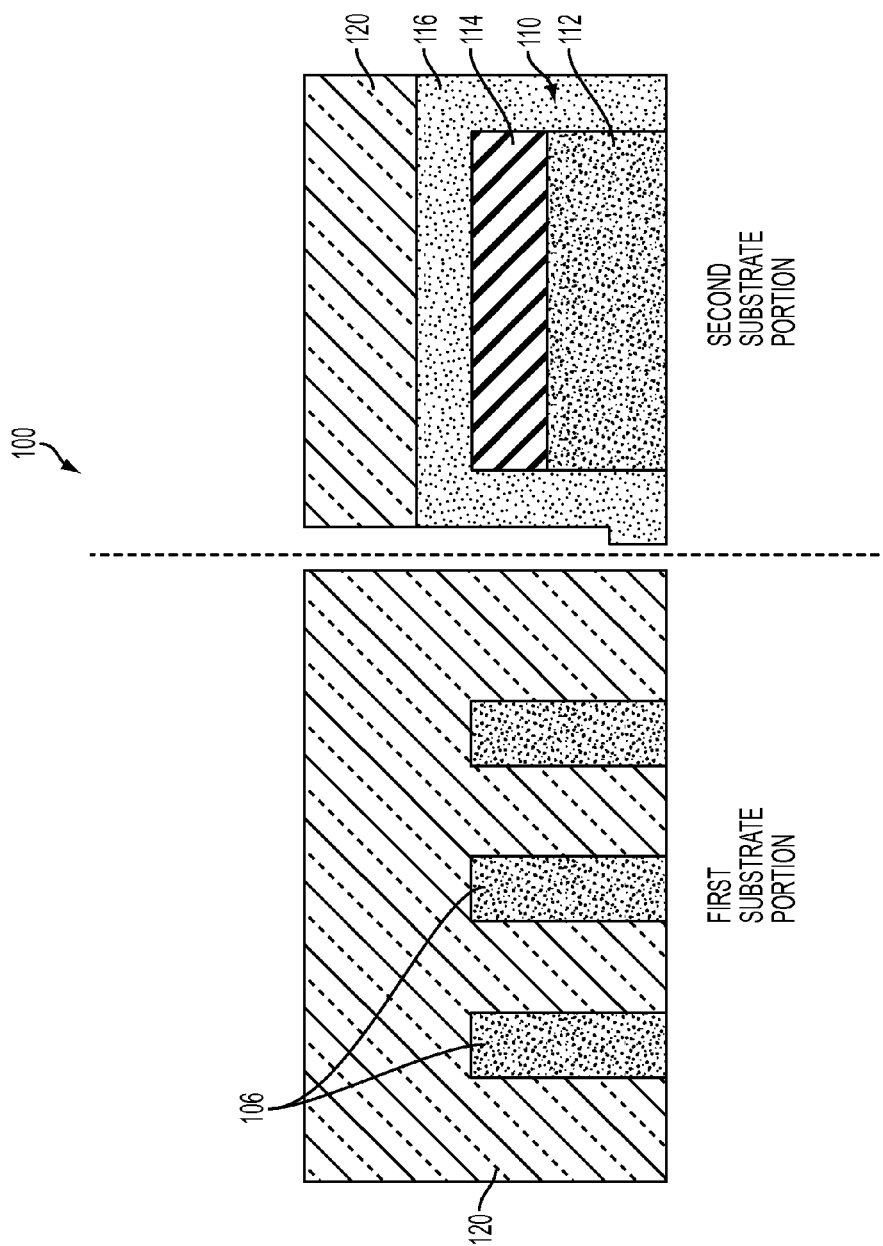
FIG. 9A illustrates the semiconductor device of FIG. 8 in the first orientation following a deposition process that deposits a polysilicon layer on the fins formed at the first substrate portion and on an upper portion of the oxide layer formed at the second substrate portion.
Figure 9B:
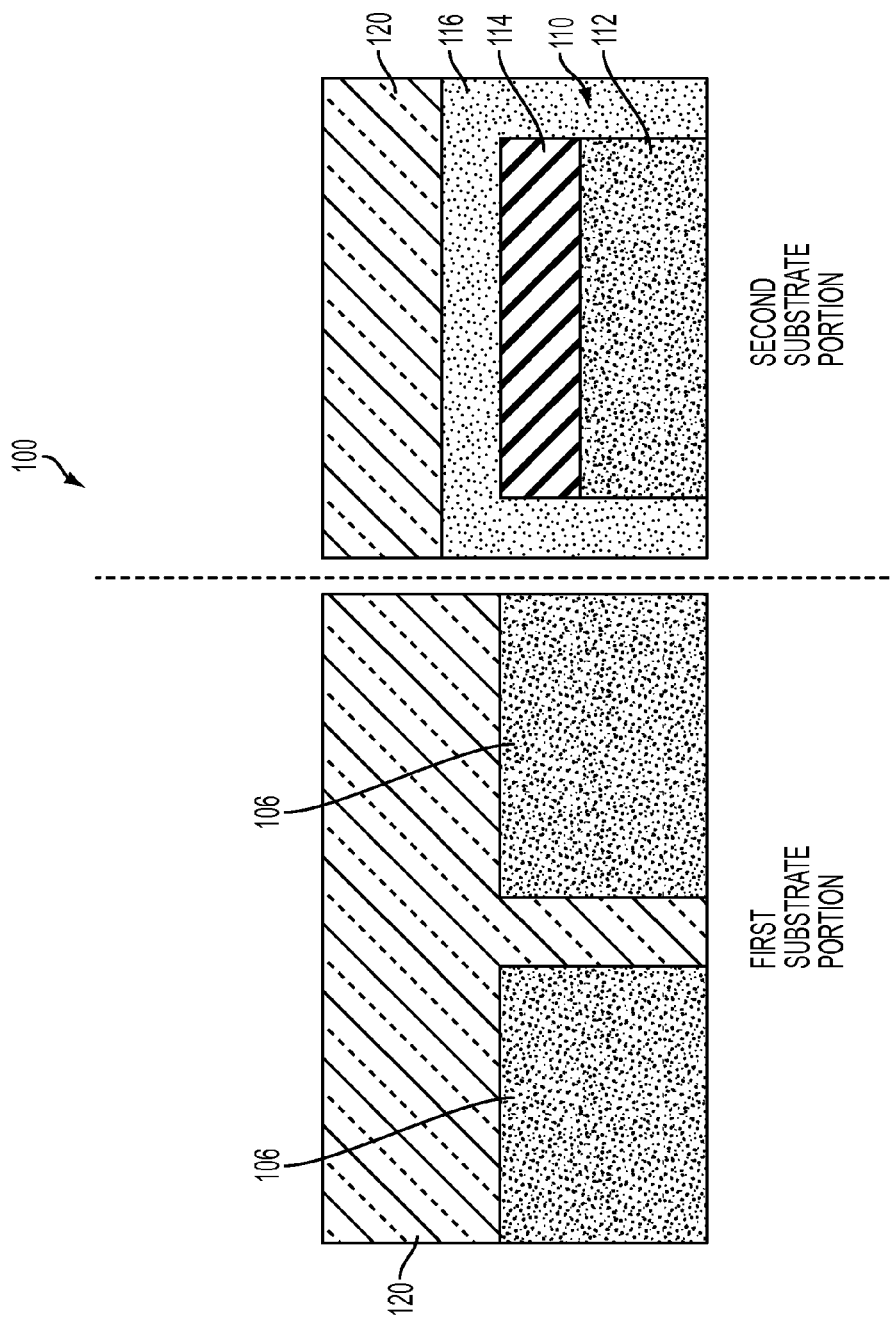
FIG. 9B illustrates the semiconductor device of FIG. 9A in a second orientation showing the polysilicon layer formed at a gate area of the first substrate portion and the polysilicon layer formed on the oxide layer.

Turning now to FIGS. 9A-9B, a polycrystalline semiconductor layer, i.e., a PC layer 120, is formed on and between the fins 106 formed at the first substrate portion 102 and is also formed on an upper surface of the oxide layer 116 at the second substrate portion 104. The PC layer 120 may be formed from a material including, but not limited to, polycrystalline silicon (i.e., polysilicon).

Figure 10A:
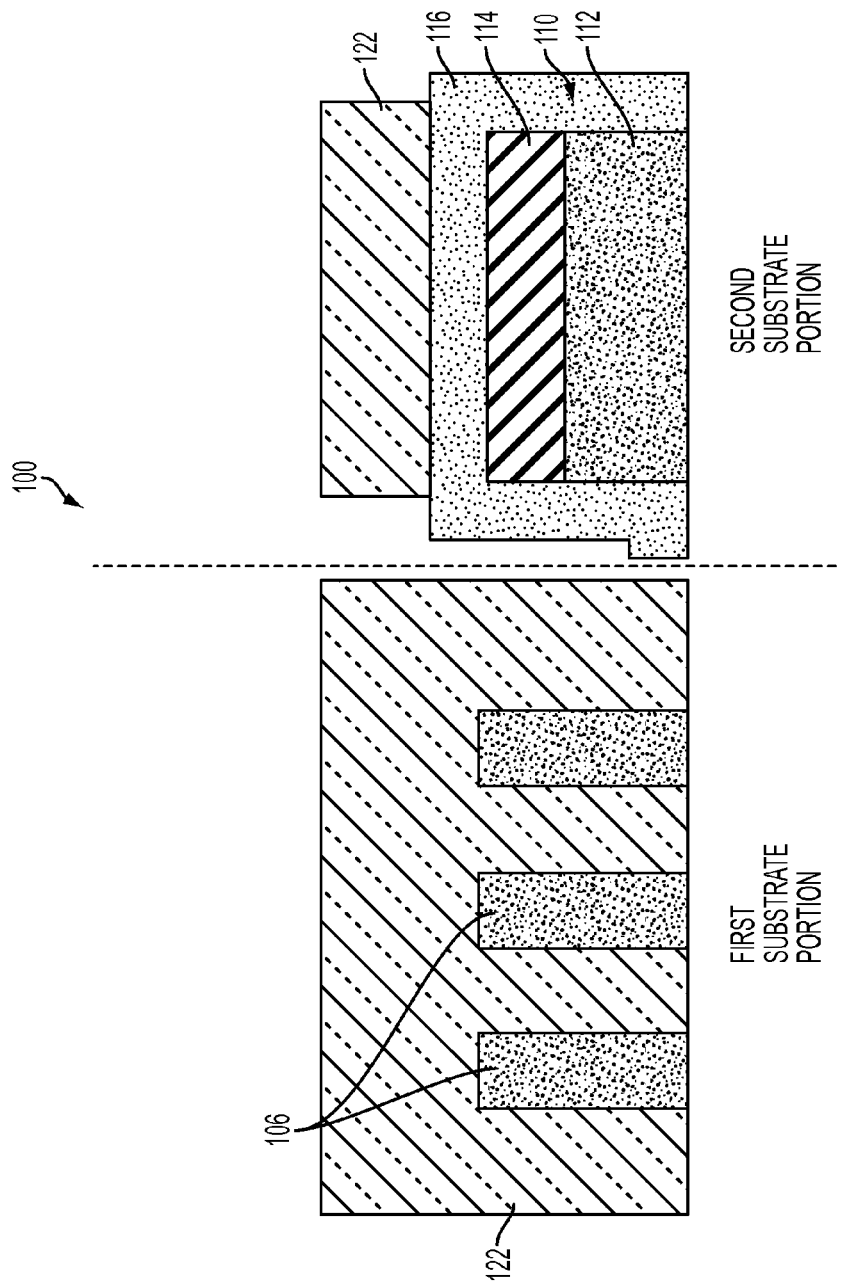
FIG. 10A illustrates the semiconductor device of FIG. 9A in the first orientation after patterning the PC layer that forms a gate across the fins and that partially etches the PC layer located at the second substrate portion.
Figure 10B:
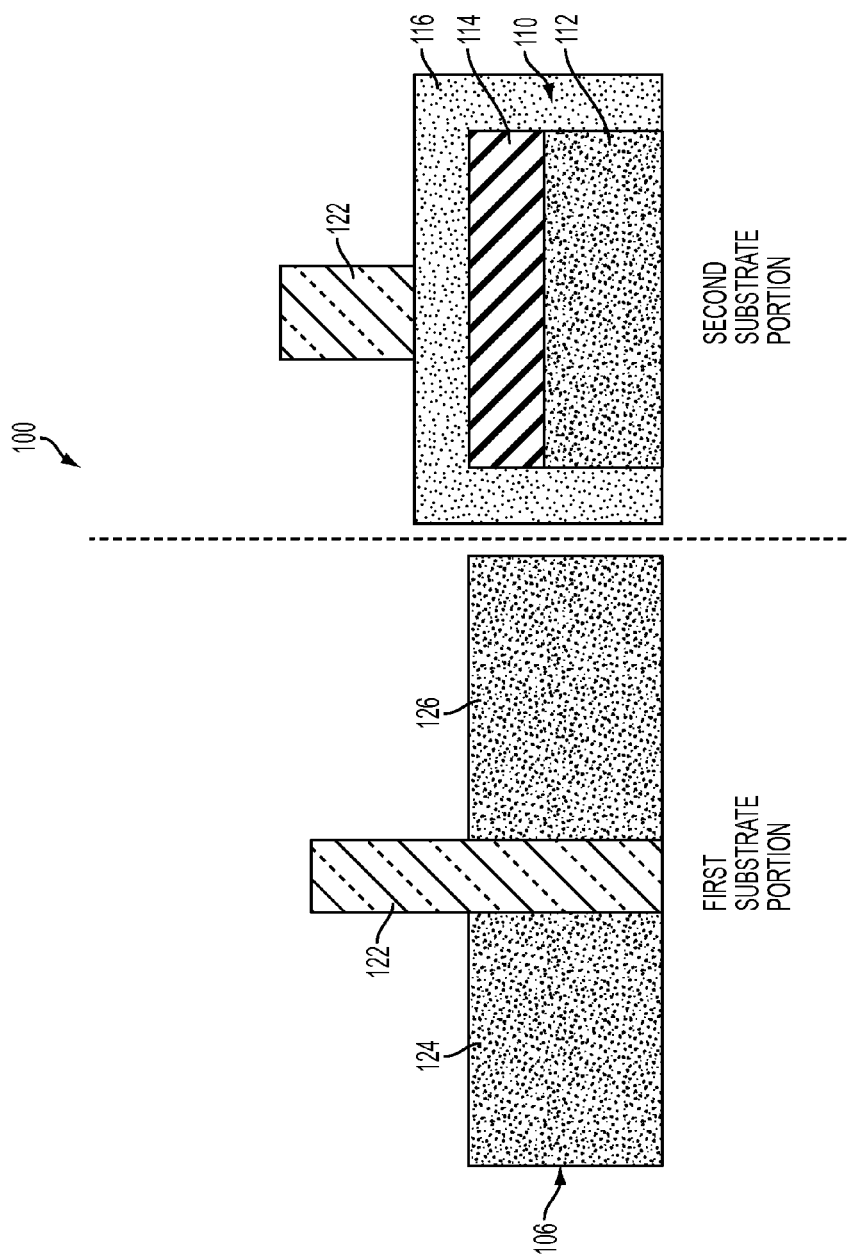
FIG. 10B illustrates the semiconductor device of FIG. 10A in the second orientation showing the gate formed at the first substrate portion and the polycarbonate layer remaining the second substrate portion.

Referring to FIGS. 10A-10B, the PC layer 120 formed on the fins 106 may be patterned to form a corresponding gate 122. For example, the PC layer 120 may be patterned such that a source region 124 and a drain region 126 of the fin 106 are exposed as illustrated in FIG. 10B. As shown in FIGS. 10A-10B, the PC layer 120 formed on the oxide layer 116 at the second substrate portion 104 is also etched such that portions of the oxide layer 116 are exposed. However, the oxide layer 116 protects the underlying planar substrate 110.

Figure 11:
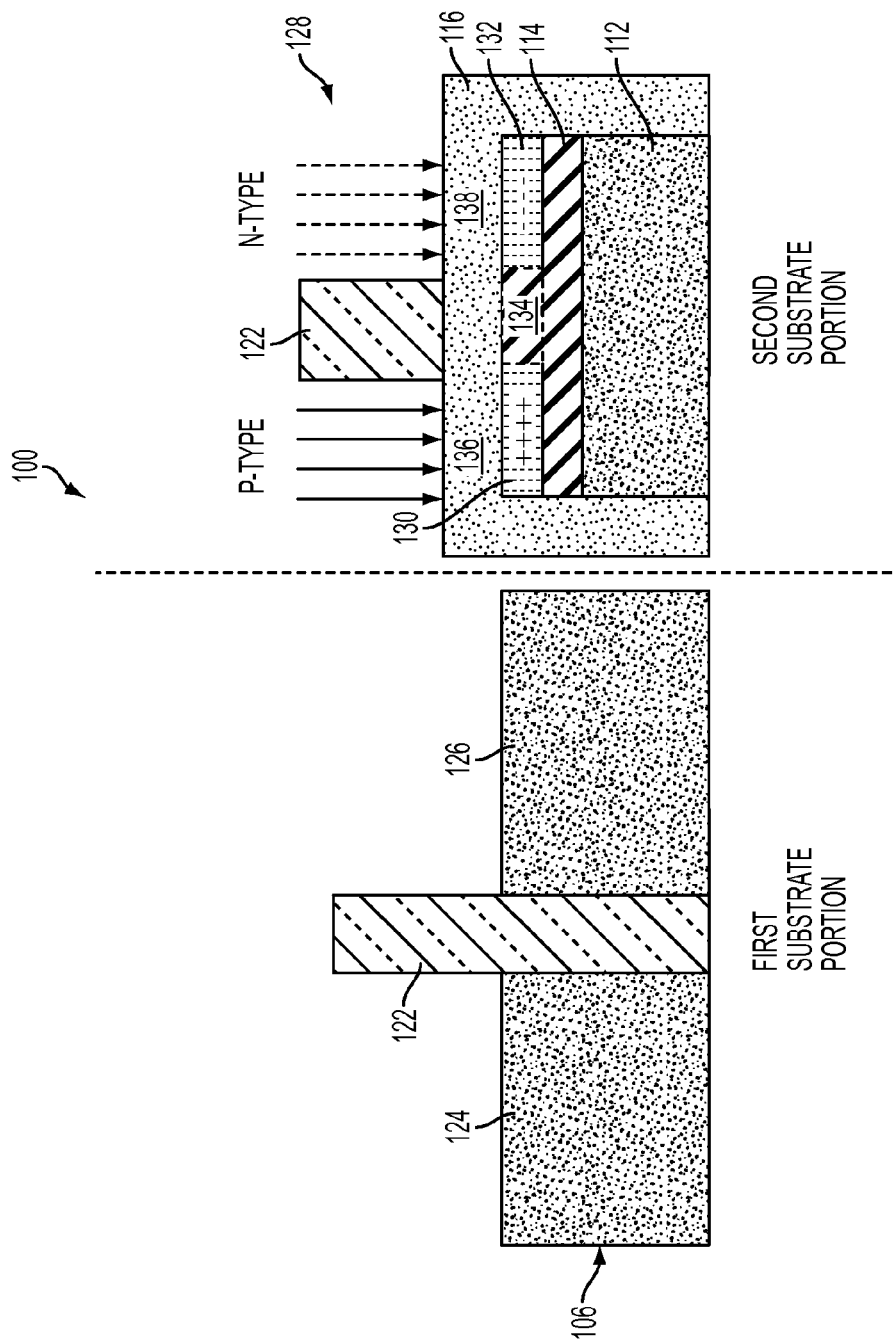

Turning to FIG. 11, a diode 128 may be formed at the second substrate portion 104 according to at least one exemplary embodiment of the invention. More specifically, P-type ions (+) and N-type ions (−) may be implanted in the doped region 114 of the planar substrate 110. The P-type ions may include, but are not limited to, boron (B). The N-type ions may include, but are not limited to, arsenic (As) or phosphorus (P). The P-type ions (+) form a positive region 130 and the N-type ions form a negative region 132. The positive and negative regions 130, 132 are separated from one another by a depletion region 134. Since the active semiconductor region 112 and the doped region 114 are protected by the oxide layer 116 during patterning of the PC layer 120, etching of the active semiconductor region 112 and/or the doped region 114 are prevented. Accordingly, defects in the depletion area 134 may be prevented and the ideality factor of the diode 128 is maintained. Further, at least one embodiment described above protects the depletion area 134 of a diode 128 formed near a finFET device, such that punch-through of the diode 128 is reduced.

In at least one embodiment, the oxide layer 116 and the remaining PC layer 120 may be maintained at the second substrate portion 104 without reducing the integrity of the diode 128. The PC layer 120 formed on the oxide layer 116 of the second substrate portion 104 may promote alignment of the positive region 130, the negative region 132 and the depletion region 134. For example, the PC layer 120 formed on the oxide layer 116 may define a first ion implantation area, i.e. a positive ion implantation area 136, adjacent a first side of the PC layer 120 and a second ion implantation area, i.e., a negative ion implantation area 138, adjacent a second side of the PC layer 120 opposite the first side. The P-type ions (+) may be deposited at the positive ion implantation area 136 to form the positive region 130 and the N-type ions (−) may be deposited at the negative ion implantation area 138 to form the negative region 132. The PC layer 120 may block ions from traveling therethrough, thereby preventing ions from being implanted at the doped region 114 therebeneath to assist in forming the depletion region 134. It is appreciated, however, that the oxide layer 116 and the remaining PC layer 120 may from the second substrate portion 104 be removed if desired.

Figure 12:
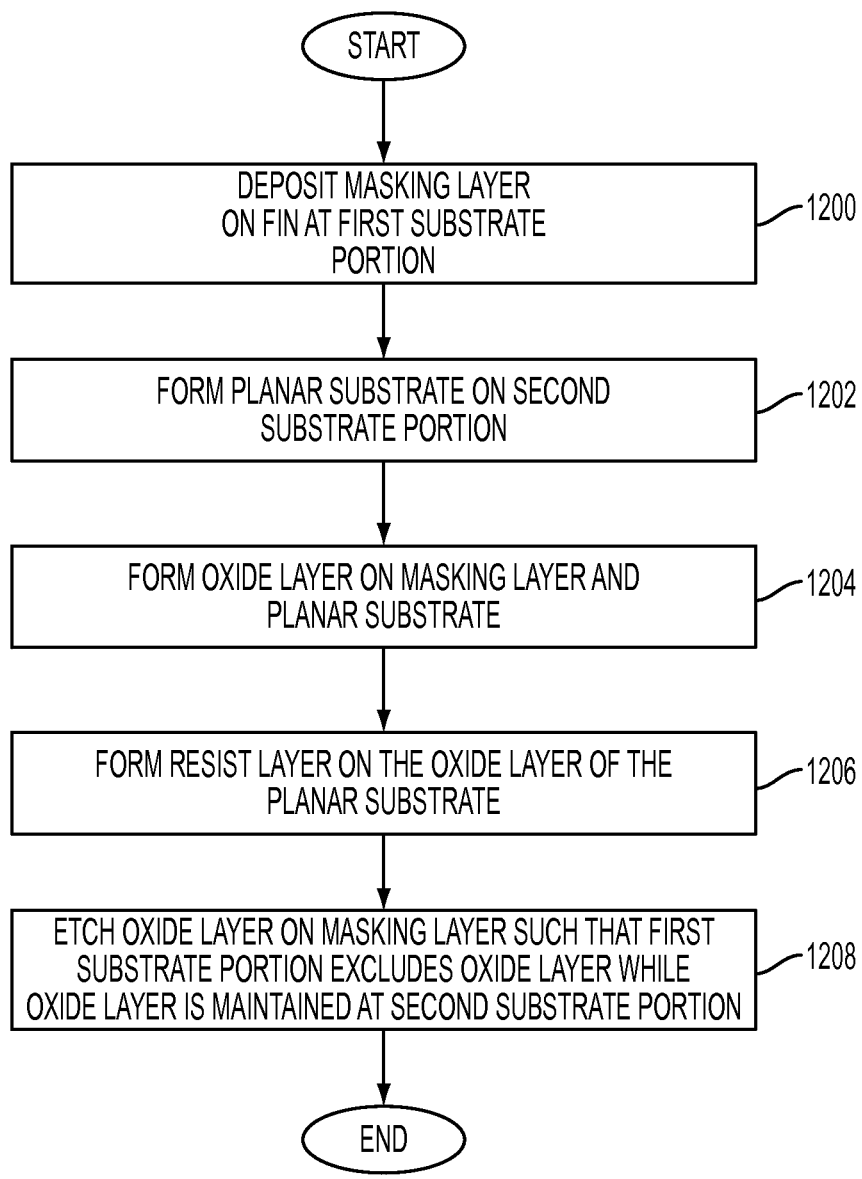
FIG. 12 is a flow diagram illustrating a method of fabricating a semiconductor device according to an exemplary embodiment of the invention.

Referring to FIG. 12, a flow diagram illustrates a method of fabricating a semiconductor device according to an exemplary embodiment of the invention. At operation 1200, a masking layer is deposited on at least one semiconductor fin formed on a first substrate portion of the semiconductor device. At operation 1202, a planar substrate is formed on a second substrate portion located a distance away from the first substrate portion. An oxide layer is formed on the masking layer and on the planar substrate at operation 1204. At operation 1206, a resist layer is formed on the oxide layer disposed of the planar substrate. At operation 1208, the oxide layer disposed on the masking layer is etched such that the first substrate portion excludes the oxide layer and the second substrate portion includes the oxide layer, and the method ends.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a semiconductor device, the method comprising:
    forming at least one semiconductor fin in a fin region of a substrate, and forming an active planar semiconductor portion in a planar region of the substrate that is excluded from the fin region;
    forming an oxide layer including a first oxide portion that covers the at least one semiconductor fin, and a second oxide portion that covers the active planar semiconductor portion;
    selectively removing the first oxide portion while maintaining the second oxide portion;
    depositing a polycrystalline layer that covers the at least one semiconductor fin and the second oxide layer portion;
    etching the polycrystalline layer to form a gate on the at least one semiconductor fin while the second oxide portion stops the etching and protects the active planar semiconductor portion; and
    implanting ions in a doped region of the active planar semiconductor portion to form a diode.

2. The method of claim 1, wherein the selectively removing the first oxide portion comprises:
    depositing a masking layer on at least one semiconductor fin formed on a first substrate portion of the semiconductor device;
    forming a resist layer on the oxide layer disposed on the planar region; and
    removing a portion of the resist layer from the oxide layer of the first substrate portion, and etching the oxide layer disposed on the masking layer such that the first substrate portion excludes the oxide layer and the second substrate portion includes the oxide layer.

3. The method of claim 2, further comprising removing the masking layer from the first substrate portion to expose the at least one semiconductor fin.

4. The method of claim 3, wherein the depositing a polycrystalline layer further comprising depositing the polycrystalline layer on the at least one semiconductor fin located at the first substrate portion and on the oxide layer located at the second substrate portion such that the oxide layer is interposed between the polycrystalline layer and the planar region.

5. The method of claim 4, wherein the implanting ions further comprises implanting first ions having a first polarity at a first area of the doped region and implanting second ions having a second polarity opposite the first polarity at a second area of the doped region.

6. The method of claim 5, wherein the first and second areas are separated by one another by a depletion area, the depletion area vertically aligned with the polycrystalline material formed on the oxide layer.

7. The method of claim 1, wherein the oxide layer has a thickness ranging from 15 nanometers to 30 nanometers.

8. The method of claim 1, wherein the oxide layer is a continuous oxide layer extending from the first substrate portion to the second substrate portion.

* * * * *